(12) United States Patent
Guo

(10) Patent No.: US 6,596,599 B1
(45) Date of Patent: Jul. 22, 2003

(54) GATE STACK FOR HIGH PERFORMANCE SUB-MICRON CMOS DEVICES

(75) Inventor: Jyh-Chyurn Guo, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/905,403

(22) Filed: Jul. 16, 2001

(51) Int. Cl.[7] .............................................. H02L 21/336
(52) U.S. Cl. ...................................................... 438/305
(58) Field of Search ................................ 438/305, 287, 438/216, 231, 302, 525, 531, 944, FOR 188, FOR 240

(56) References Cited

U.S. PATENT DOCUMENTS

| | | | | |
|---|---|---|---|---|
| 5,286,665 | A | * 2/1994 | Muragishi et al. | 438/257 |
| 5,864,160 | A | 1/1999 | Buynoski | 257/339 |
| 5,990,532 | A | 11/1999 | Gardner | 257/410 |
| 6,087,208 | A | 7/2000 | Krivokapic et al. | 438/183 |
| 6,110,790 | A | 8/2000 | Chen | 438/305 |
| 6,114,228 | A | 9/2000 | Gardner et al. | 438/585 |
| 6,180,499 | B1 | * 1/2001 | Yu | 438/585 |
| 6,190,981 | B1 | * 2/2001 | Lin et al. | 438/305 |
| 6,194,748 | B1 | 2/2001 | Yu | 257/216 |
| 6,207,485 | B1 | 3/2001 | Gardner et al. | 438/216 |
| 6,306,715 | B1 | * 10/2001 | Chan et al. | 438/301 |
| 6,399,469 | B1 | * 6/2002 | Yu | 438/595 |
| 2001/0026982 | A1 | * 10/2001 | Doi et al. | 438/305 |
| 2002/0005581 | A1 | * 1/2002 | Kurata | 257/756 |
| 2002/0122995 | A1 | * 9/2002 | Mancini et al. | 430/5 |

OTHER PUBLICATIONS

Wolf S. "Silicon Processing for the VLSI–ERA: vol. 1–Process Technology", 1986, Lattice Pr., vol. 1, p. 441–442.*
F. Boeuf et al., "16 nm planar NMOSFET manufacturable within state–of–the–art CMOS process thanks to specific design and optimisation," 2001, IEEE.

* cited by examiner

Primary Examiner—George Fourson
Assistant Examiner—Suk San Foong
(74) Attorney, Agent, or Firm—George O. Saile; Stephen B. Ackerman

(57) ABSTRACT

A new method is provided for the creation of sub-micron gate electrode structures. A high-k dielectric is used for the gate dielectric, providing increased inversion carrier density without having to resort to aggressive scaling of the thickness of the gate dielectric while at the same time preventing excessive gate leakage current from occurring. Further, air-gap spacers are formed over a stacked gate structure. The gate structure consists of pre-doped polysilicon of polysilicon-germanium, thus maintaining superior control over channel inversion carriers. The vertical field between the gate structure and the channel region of the gate is maximized by the high-k gate dielectric, capacitive coupling between the source/drain regions of the structure and the gate electrode is minimized by the gate spacers that contain an air gap.

18 Claims, 5 Drawing Sheets

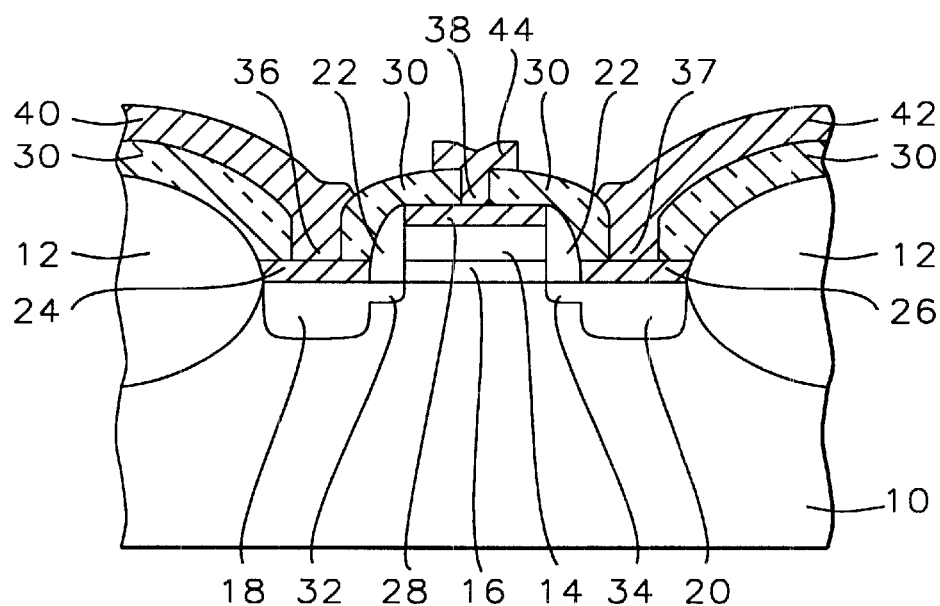
FIG. 1 – Prior Art
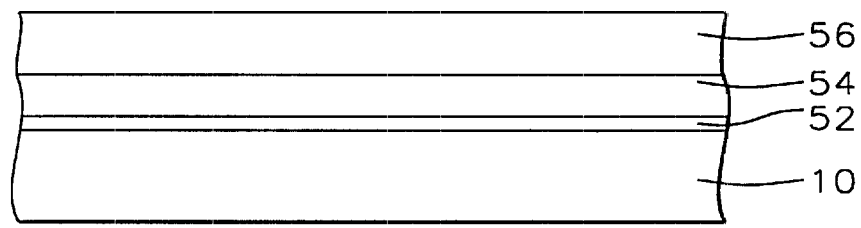
FIG. 2
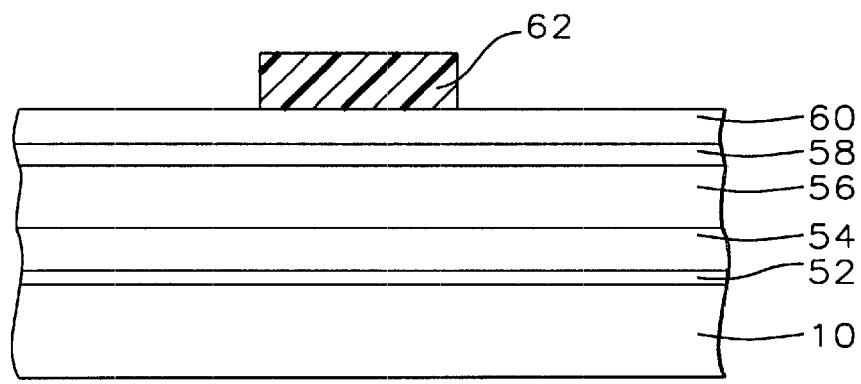
FIG. 3

GATE STACK FOR HIGH PERFORMANCE SUB-MICRON CMOS DEVICES

BACKGROUND OF THE INVENTION (1) Field of the Invention

The invention relates to the fabrication of integrated circuit devices, and more particularly, to a method of creating a gate electrode for CMOS devices having sub-micron channel length.

(2) Description of the Prior Art

CMOS devices, which form the essential components of DRAM cells, are typically created using overlying layers of semiconductor material with the lowest layer being a layer of pad oxide and the highest layer being a layer of silicided material that serves as low resistivity electrical contact to the gate electrode. A gate electrode is typically created overlying the layer of pad oxide, this layer is also referred to as gate dielectric or gate stack adopting oxide. Current technology for the creation of CMOS devices uses a silicon dioxide layer as the gate dielectric for CMOS devices. With a sharp reduction in device feature size, the thickness of the layer of gate dielectric must also be reduced, for the era of device features in the sub-micron range the gate thickness is approaching 2 nanometers or less. A continued reduction of the thickness of the layer of gate dielectric leads to increasing the tunneling current through this thin layer of gate dielectric. For this reason a thin layer of silicon dioxide (thinner than about 1.5 nm) cannot be used as the gate dielectric for CMOS devices having sub-micron device dimensions.

A concerted effort is underway in the industry to provide materials that can be used for a gate dielectric of a gate electrode. These materials must have a high dielectric constant, which allows for the layer of gate dielectric to be thicker while maintaining device performance and also reducing the tunneling current through the layer of gate dielectric. The dielectric constant of the searched for materials is measured with respect to the dielectric constant of silicon dioxide, since silicon dioxide has for past device creations formed the dielectric of choice for the gate dielectric. The range of dielectric constants varies between about 3.9 for silicon dioxide and about 10 for high-k dielectric layers. Other materials that can be cited in this respect include $ZrO_2$ with a dielectric constant of about 25, $HfO_2$ with a dielectric constant of about 30 and $Al_2O_3$ with a dielectric constant of about 25.

The MOSFET device is one of the most widely used devices in the semiconductor industry and forms an integral part of most semiconductor devices. The MOSFET device comprises, in its simplest form, a three-terminal device with electrical contacts being provided to the source/drain regions and the gate electrode of the device. A channel region is formed in the substrate underlying the gate electrode, the channel region connects the source region (in the surface of the substrate) with the drain region, also in the surface of the substrate.

Increased miniaturization of semiconductor devices creates a host of complex issues that must be addressed in order to maintain device performance. The conventional approach of using a layer of silicon oxide, over which the gate electrode is created, and of using silicon nitride for the gate spacers creates problems of scaling of the thickness of the layer of gate oxide (due to excessive leakage current, which is induced by direct tunneling) and scaling of the spacer width (due to the increased coupling capacitance and the reduced insulation between the gate electrode and the source/drain regions of the structure). The invention addresses these concerns and provides a method in which an air gap spacer is provided combined with a polysilicon-Ge gate or a pre-doped polysilicon-silicon gate.

U.S. Pat. No. 6,110,790 (Chen) shows a gate with an air gap spacer.

U.S. Pat. No. 6,194,748 (Yu) shows a gate stack with a high K gate dielectric and low-k spacers.

U.S. Pat. No. 5,990,532 (Gardner) shows a method for creating an air gap under the gate by an etch back of the gate dielectric and an air sealing deposition.

U.S. Pat. No. 5,864,160 (Buynoski) shows a gate with an air gap on one side and a sealing step.

SUMMARY OF THE INVENTION

A principle objective of the invention is to provide a gate electrode structure having sub-micron device feature lengths.

Another objective of the invention is to provide a gate electrode structure having sub-micron device feature lengths whereby scaling issues of the gate oxide of the device are addressed.

Yet another objective of the invention is to provide a gate electrode structure having sub-micron device feature lengths whereby air-gap spacers are combined with selected gate dielectrics.

A still further objective of the invention is to provide a gate electrode structure having sub-micron device feature lengths of increased drive current capability.

A still further objective of the invention is to provide a gate electrode structure having sub-micron device feature lengths of reduced parasitic capacitance impact.

In accordance with the objectives of the invention a new method is provided for the creation of sub-micron gate electrode structures. A high-k dielectric is used for the gate dielectric, providing increased inversion carrier density without having to resort to aggressive scaling of the thickness of the gate dielectric while at the same time preventing excessive gate leakage current from occurring. Further, air-gap spacers are formed over a stacked gate structure. The gate structure consists of pre-doped polysilicon of polysilicon-germanium, thus maintaining superior control over channel inversion carriers. The vertical field between the gate structure and the channel region of the gate is maximized by the high-k gate dielectric, capacitive coupling between the source/drain regions of the structure and the gate electrode is minimized by the gate spacers that contain an air gap.

BRIEF DESCRIPTION OF THE DRAWINGS

FIG. 1 shows a cross section of a conventional gate electrode.

FIGS. 2 through 14 address the invention, as follows:

FIG. 2 shows a cross section of the surface of a substrate over which successively have been deposited a layer of high-k dielectric (for the gate dielectric) over which a layer of bottom gate material has been deposited over which a layer of top gate material has been deposited.

FIG. 3 shows the structure of FIG. 2 over which additionally have been deposited a layer of silicon nitride or SiON (to form a hard mask layer) over which a layer of BARC has been deposited. A patterned and developed layer of photoresist has been created over the surface of the layer of BARC.

FIG. 4 shows a cross section after the layer of BARC and the layer of hard mask material have been etched in accordance with the photoresist mask that has been created over the surface of the BARC layer.

FIG. 5 shows a cross section after the photoresist mask and the patterned layer of BARC have been removed, the layers of top and bottom gate electrode material have been etched in accordance with the pattern of the hard mask layer, an overetch has been created in the bottom layer of gate material.

FIG. 6 shows a cross section of the process of implanting LDD impurities into the surface of the substrate, creating LDD regions in the surface of substrate, self aligned with the gate electrode structure.

FIG. 7 shows a cross section after the patterned hard mask layer has been removed, a layer of first gate spacer material of low-k dielectric has been deposited over the gate structure including the exposed surface regions of the surrounding layer of gate dielectric.

FIG. 8 shows a cross section after the first gate spacers are formed over the sidewalls of the gate structure.

FIG. 9 shows a cross section after a layer second gate spacer material has been deposited.

FIG. 10 shows a cross section after the second gate spacers are formed over the sidewalls of the gate structure.

FIG. 11 shows a cross section during source/drain region implant into the surface of the substrate.

FIG. 12 shows a cross section after salicidation of the contact regions of the gate structure.

FIG. 13 shows a cross section after the gate structure has been prepared for the removal of the first gate spacers.

FIG. 14 shows a cross section during the removal of the first gate spacers.

DESCRIPTION OF THE PREFERRED EMBODIMENTS

Figure 4:
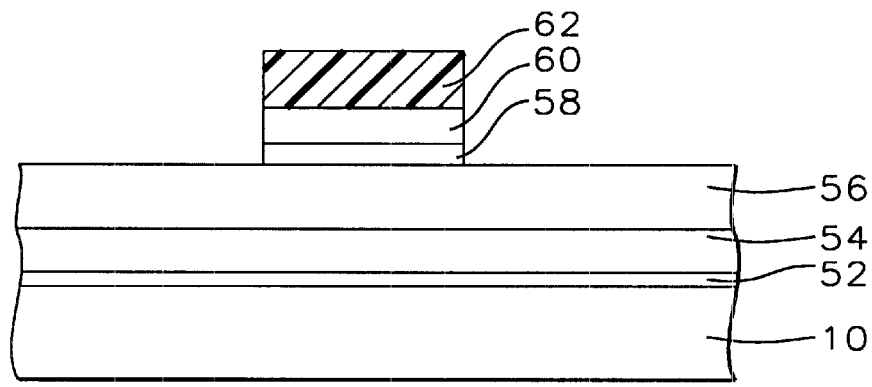

Some of the essential points that must be addressed in the creation of CMOS devices having sub-micron channel length can be highlighted as follows:

the thickness of the layer of gate oxide must be made as small as possible since the drive current of a CMOS device increases with decreasing thickness of the layer of gate oxide; a thin layer of gate oxide allows the gate to retain strong control of the channel charge region underneath the gate electrode shallow junction depths are required for the device impurity implants, the shallow junction depth prevents the drain field from extending into the channel region underneath the gate electrode the thin layer of gate dielectric must be grown over the surface of the substrate in a uniform manner, this to prevent uneven distribution of the electromagnetic field between the gate electrode and the channel region of the gate electrode the impurity content of the layer of gate dielectric must be very low to prevent concentration of ion migration and the therefrom following damage to the layer of gate oxide, affecting the reliability of the CMOS device it is desirable to use materials for the gate dielectric that have a dielectric constant k which is as high as possible, with a target value exceeding 100; this allows for the creation of a (physically) thick layer of gate dielectric while the effective (operational) thickness of the layer of gate dielectric is low; this avoids the concerns that are raised by the use of ultra-thin layers of gate dielectric, as highlighted above; comparatively, a thin layer of dielectric material, having a low dielectric constant and a thickness in the range of 1 and 30 Angstrom, operationally compares with a thick layer of gate dielectric having a high dielectric constant and a thickness in the range of 30 to 300 Angstrom an ultra thin layer of gate dielectric may not be able to prevent the migration of impurity implants (such as boron, implanted into a layer of polysilicon to create the conductivity of the body of the gate electrode) into the channel region of the underlying substrate, causing leakage current of the gate electrode to the substrate it is generally accepted that, in order to create gate electrodes having sub-micron device features, the effective thickness of the layer of gate dielectric must be equivalent to a conventional layer of silicon dioxide having a thickness of about 20 Angstrom or less reduced device dimensions, under constant conditions of operating voltages of the gate electrode, can result in an increase of the electrical field in the underlying silicon substrate; this increased field strength in turn may result in hot electrons or hot holes being injected from the channel region of the device into the overlying layer of gate dielectric; this charge injection results in potential damage to the layer of gate dielectric, affecting the reliability of the gate electrode; Lightly Doped Drain (LDD) regions have been the conventional answer to this concern; since however these regions are applied adjacent to both the source and the drain region, while these LDD regions are essentially required only adjacent to the drain region, the LDD implants raise the parasitic resistance between the source region and the channel region of the device, lowering the current that can flow between the source and the drain regions of the gate electrode and thus reducing the device switching speed the current that can flow through the channel region of a gate electrode is essentially determined by the source to channel interface the threshold voltage of the device is also essentially determined by the source to channel interface for sub-micron device dimensions, that is a channel length of about 0.20 $\mu$m or less, the use of LDD regions to control hot carrier injection becomes ineffective due to the small junction depth of LDD impurity implants device switching speed can be increased by either raising the current that flows between the source and the drain region of the device or by reducing (the impact of) parasitic capacitances and/or resistors on the operation of the gate electrode, and to create CMOS devices having high switching speeds, it is required that the channel length is made as short as possible, providing a shortest possible path for the electrons to travel.

FIG. 1 shows a cross section of a conventional CMOS device, the creation of this device will be briefly highlighted using the device elements that are highlighted in FIG. 1. The process of creating a CMOS device starts by providing a semiconductor substrate 10, FIG. 1. Insulation regions 12, that bound the active region in the surface of substrate 10, isolate the active region and may comprise regions of Field Oxide (FOX) isolation or Shallow Trench Isolation (STI). A thin layer 16 of gate oxide is grown over the surface of the substrate 10 in the active device region. To create the gate structure, a layer 14 of polysilicon is grown over the thin layer 16 of gate oxide. The polysilicon layer 14 is masked and the exposed polysilicon and the thin layer of oxide are etched to create the polysilicon gate 14 that is separated from the substrate 10 by the remaining thin layer 16 of oxide. The doping of the source/drain regions starts with creating the lightly N+ doped diffusion (LDD) regions 32/34. The sidewall spacers 22 for the gate structure are formed after which the source (18) and drain (20) regions doping is completed by doping these source/drain regions 18/20 to the desired level of conductivity using an impurity implant.

Low resistivity contact points to the source (24) and drain (26) regions and the electrode gate (28) are then formed by first depositing a layer of titanium or cobalt with TIN over the surface of the source/drain regions and the top surface of the gate electrode. This titanium or cobalt is annealed causing the deposited titanium or cobalt to react with the underlying silicon of the source/gain regions and the doped surface of the gate electrode. This anneal forms layers of titanium silicide or cobalt silicide 24/26 on the surfaces of the source/drain regions and layer 28 on the top surface of the gate electrode. Cobalt with TiN are used to form cobalt salicide in which the TiN serves as a barrier layer.

Metal contacts with the source (40) and drain (42) regions and the gate electrode (44) are formed as a final step. A layer 30 of dielectric, such as silicon oxide, is blanket deposited over the surface of the created structure. This layer of dielectric is patterned and etched to create contact openings 36/37 over the source/drain regions and opening 38 over the top surface of the gate electrode. A metallization layer is deposited over the patterned layer 30 of dielectric, establishing the electrical contacts 40/42 with the source/drain regions and 44 with the top surface of the gate electrode.

It has previously been pointed out that materials, used for a gate dielectric, that is the layer of material overlying the substrate and forming a buffer layer between the gate electrode and the substrate, must have a high dielectric constant. This allows for the layer of gate dielectric to be thicker while maintaining device performance requirements and reducing the tunneling current through the layer of gate dielectric. The dielectric constant of the materials is measured with respect to the dielectric constant of silicon dioxide, since silicon dioxide has for past device creations formed the dielectric of choice that has been used for the gate electrode. The range of dielectric constants varies between about 3.9 for silicon dioxide and about 30 for high-k dielectric layers.

Referring now specifically to the cross section that is shown in FIG. 2, there is shown:

10, the surface of a semiconductor substrate over the surface of which a gate electrode is to be created, 52, a layer of high-k gate dielectric that has been created over the surface of substrate 10

54, layer of bottom gate material that has been deposited over the surface of layer 52 of gate dielectric, and 56, layer of top gate material that has been deposited over the surface of layer 54 of bottom gate material.

Specifically, the layer 52 of gate dielectric is to comprise a layer of material having a high dielectric constant. As examples of dielectric materials with high dielectric constant can be cited SiN (7.4) and $Al_2O_3$ (8.5). Other materials that meet requirements of high dielectric constant are titanium oxide ($TiO_2$), zirconium oxide ($ZrO_2$), tantalum oxide ($Ta_2O_5$), barium titanium oxide ($BaTiO_3$) and strontium titanium oxide ($SrTiO_3$) This layer 52 is preferably deposited to a thickness between about 25 and 200 Angstrom and more preferably to a thickness of about 50 Angstrom, using methods of LPCVD procedures at a pressure between about 200 mTorr and 800 mTorr, at a temperature between about 500 and 700 degrees C., followed by annealing at a temperature between about 700 and 900 degrees C.

The bottom gate electrode layer 54 preferably comprises polysilicon-germanium or doped polysilicon, layer 54 is deposited using LPCVD procedures, at a temperature between about 500 and 700 degrees C., to a thickness between about 500 to 5000 Angstrom. Layer 54 of doped polysilicon be in-situ doped with an impurity implant of phosphorous (n-type impurity) or boron (p-type impurity).

Specifically, layer 54 of doped polysilicon can be doped as follows:

for NMOS: N+ doped using As or P as a dopant with a dopant dose of between about $1\times10^{14}$ and $1\times10^{16}$ atoms/$cm^2$ for PMOS: P+ doped using $BF_2$ or B as a dopant with a dopant dose of between about $1\times10^{14}$ and $1\times10^{16}$ atoms/$cm^2$.

The layer 56 of top gate material preferably comprises undoped polysilicon, deposited using LPCVD procedures, at a temperature between about 600 and 800 degrees C., to a thickness between about 500 to 5000 Angstrom.

FIG. 3 shows a cross section of the creation of a hard mask layer in preparation for the etching of the layers 54 and 56 of top and bottom gate electrode material, a layer of ARC is also deposited, as follows:

58, a layer of silicon nitride or SiON, forming a hardmask layer 60, a layer of BARC deposited over the surface of layer 58 of silicon nitride or SiON, and 62, a layer of photoresist.

The layer 58, FIG. 3, of silicon nitride ($Si_3Ni_4$) can be deposited using LPCVD or PECVD procedures at a pressure between about 200 mTorr and 400 mTorr, at a temperature between about 600 and 800 degrees C., to a thickness of about 100 and 400 Angstrom using $NH_3$ and $SiH_4$ or $SiCl_2H_2$. The silicon nitride layer 58 can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 100 and 400 Angstrom.

Layer 58 may also comprise SiON, deposited by using LPCVD over the surface of layer 56, to a thickness of between 400 and 800 Angstrom, the.process of deposition is time controlled.

Layer 60, FIG. 3, is a layer that is opaque material that is impervious to the rays of visible light such that actinic light, having photo chemical properties or effects and that is normally used to created photosensitive exposures such as in photoresist, does not penetrate through this layer. This results in being able to clearly etch layer 60 after which layer 58 of silicon nitride can be etched.

Regarding layer 60 of BARC, it is conventional to dry etch a stack of thin layers, which can include a photoresist that is used for patterning the underlying layer, by including an anti-reflective coating, also known as an Bottom Anti-Reflective (BARC) layer, in the stack of layers. The BARC layer is used for covering the surface of the underlying layer and is typically formed prior to coating with photoresist. The BARC is used to reduce deleterious effects resulting from undesired reflection of the UV light used to expose the photoresist layer. A common BARC is TiN, which may be conveniently deposited overlying a deposited metallic layer by sputtering in the same machine used to apply the metal, (such as aluminum or an aluminum alloy) and a barrier material (such as metal, metal compound or silicide). A typical ARC coating is between about 300 and 1500 angstrom thick. For 0.1 μm logic technology, organic BARC is used with a thickness in the range of 300 and 800 Angstrom.

For previous, that is larger than 0.1 μm design, CMOS processing, the preferred material for the creation of layer 60, which forms a BARC layer, comprises titanium nitride, tantalum, tungsten, niobium, molybdenum, Ti/TiN or Ti/W and is more preferably formed from TiN. However, for CMOS technology with 0.1 μm design, organic BARC has been identified as the optimum BARC material.

Typical processing conditions for the formation of layer 60 of TiN are as follows: source: titanium nitride, at a temperature of about 25 to 150 degrees C., a pressure of about 100 to 150 mTorr, for a time duration of about 5 to 10 seconds, using Ar as sputtering ions.

The process of depositing and patterning the layer 62 of photoresist uses conventional methods of-photoresist coating, photolithography and masking. Layer 62 of photoresist can be etched by applying $O_2$ plasma and then wet stripping by using $H_2SO_4$, $H_2O_2$ and $NH_4OH$ solution. The layer 62 of photoresist that remains in place overlying the layer 60 of BARC is aligned with the surface region of substrate 10 over which a gate electrode structure is to be created.

FIG. 4 shows a cross section of the structure after layer 60, of BARC material, and layer 58, of hard mask material, have been etched in accordance with the photoresist mask 62 of FIG. 3.

Layer 60, if this layer is selected to comprise TiN, can be etched using anisotropic etching with an etchant gas of one of the group of $CF_4$, $CHF_3$, $CHCl_3$, $CCl_4$, $BCl_4$ and $Cl_2$ at a temperature between about 100 and 200 degrees C.

Layer 58, if this layer is selected to comprise silicon nitride, can be etched with a silicon nitride etch recipe comprising $CHF_3$ at a flow rate between about 0 and 100 sccm, $CF_4$ at between about 0 and 50 sccm and Ar at a flow rate between about 50 and 150 sccm. Silicon nitride layer 58 can also be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 58 can also be wet etched using a.buffered oxide etchant (BOE). The BOE may comprise a mixed solution of fluoroammonium and fluorohydrogen (7:1) and phosphoric acid solution. The silicon nitride layer 58 can also be etched using anisotropic RIE using $CHF_3$ or $SF_6$-$O_2$ or $SF_6$/$HB_8$ as an etchant. The preferred method of removing silicon nitride is an isotropic wet etch process using hot phosphoric acid. The silicon nitride layer 58 can also be dipped into phosphoric acid ($H_3PO_4$) to be removed. The nitride layer can also be removed from the trenches created in the layer of photoresist by dipping the structure into hot phosphoric acid ($H_3PO_4$) (standard wet nitride removal)

Figure 5:
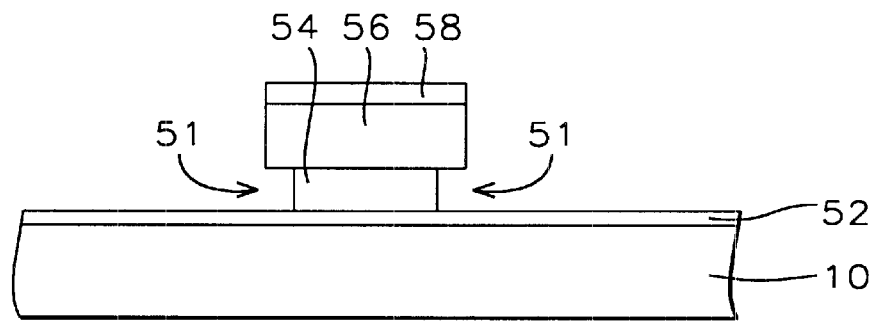

FIG. 5 shows a cross section of the substrate 10 after the overlying photoresist mask 62, FIG. 4, and the layer 60 of BARC material have been removed from the surface and after layers 54 (bottom gate layer) and 56 (top gate layer) have been etched in accordance with the hard mask 58 that has been shown in cross section in FIG. 5.

The removal of patterned layer 62 of photoresist is performed applying conventional methods of photoresist removal, as previously highlighted. Patterned layer 60, FIG. 4, can be etched using anisotropic etching with an etchant gas of one of the group of $CF_4$, $CHF_3$, $CHCl_3$, $CCl_4$, $BCl_4$ and $Cl_2$ at a temperature between about 100 and 200 degrees C. As an alternative method, layer 60 may be removed applying methods of Chemical Mechanical Polishing, down to the surface of layer 58 of hard mask material such as silicon nitride. For polishing of the layer 60, the hard mask layer 58 forms a good interface for end-point detection of the polishing step.

After the layers 62 (of photoresist) and 60 (of BARC material), FIG. 4, have been removed from above the substrate 10, the surface of layer 58 of hard mask material (such as silicon nitride or SiON) is exposed and can therefore serve as a hard mask for the etching of the layers 54 and 56. In etching layers 56 and 54, FIG. 5, the etching rate of the two layers is selected such that the etching rate of the lower layer 54 is larger than the etching rate of the top layer 56, resulting in more material of layer 54 being removed than is removed from layer 56. This creates the undercut 51 that has been shown in cross section in FIG. 5.

Regarding the selection of an etch ratio being selected so that the bottom layer is removed at a faster rate than the top layer, the following can be stated. Generally, the thickness of the bottom gate 54, is considerably less than the thickness of the top gate 56. The lateral removal of the top gate 56 is therefore considered negligible, since the etch process is adjusted to stop on the gate dielectric 52.

Typical etching of a layer of polysilicon uses a $CF_4$/$CHF_3$ etch recipe, applying anisotropic plasma etching. Polysilicon layers 56 and 54 can also be etched using as an etchant gas $SF_6$, $SiO_2$ and $Si_3N_4$ with a fluorocarbon.

Figure 6:
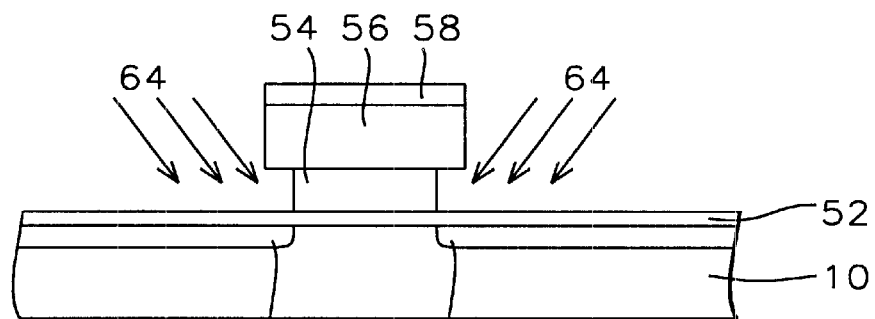

The invention next continues by providing LDD implants 64, FIG. 6, implanted under an angle with the surface of substrate 10 that is smaller than 90 degrees by a measurable amount. As examples of LDD implants can be cited:

a NMOS implant using arsenic with an energy within the range of between 1 to 10 keV and a dose within the range of between 1e14 to 1e16 atoms/$cm^2$, and a PMOS implant using $BF_2$ with an energy within the range of between 1 to 10 keV and a dose within the range of between 1e14 to 5e15 atoms/$cm^2$.

Pocket implants are performed using a tilt-angle implant, using as impurities indium and boron for NMOS devices or arsenic and phosphorous for PMOS devices. The angle under which the implant is performed can be selected to be in the range between about 15 degrees and 45 degrees with the surface of substrate 10. LDD regions 61 (source) and 63 (drain) are in this manner created in the surface of substrate 10.

Figure 7:
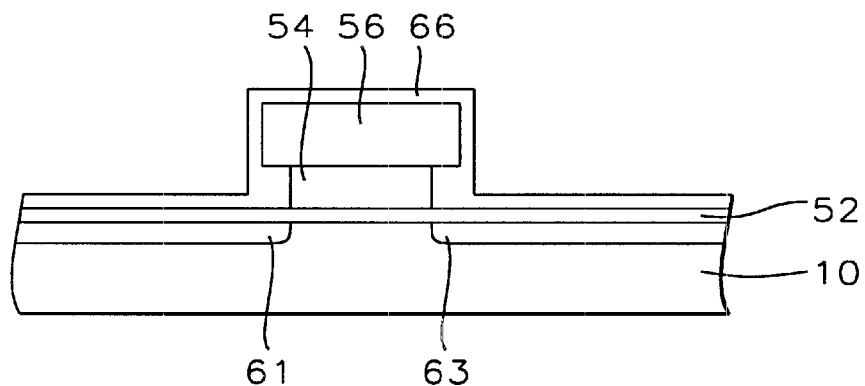

The hard mask layer 58, having completed its function of protecting layers 54 and 56 during the etch of these layers, can now be removed from the surface of layer 56, as shown in cross section in FIG. 7. Processing methods that can be applied for the removal of layer 58 have previously been highlighted.

FIG. 7 further shows in cross section how a layer 66 of low-k dielectric has been deposited over the surface of the layer 52 of gate dielectric, including the exposed surface of the gate structure 54/56. This layer 66 of low dielectric is further used to create first spacers over the sidewalls of the gate structure 54/56. Gate spacers are typically created using a wide range of materials such as silicon nitride, silicon oxide, BSG, PSG, polysilicon, other materials preferably of a dielectric nature, CVD oxide formed from a TEOS source. Layer 66 of low-k dielectric can be deposited using methods of spin-coating followed by baking or by methods of CVD deposition.

Figure 8:
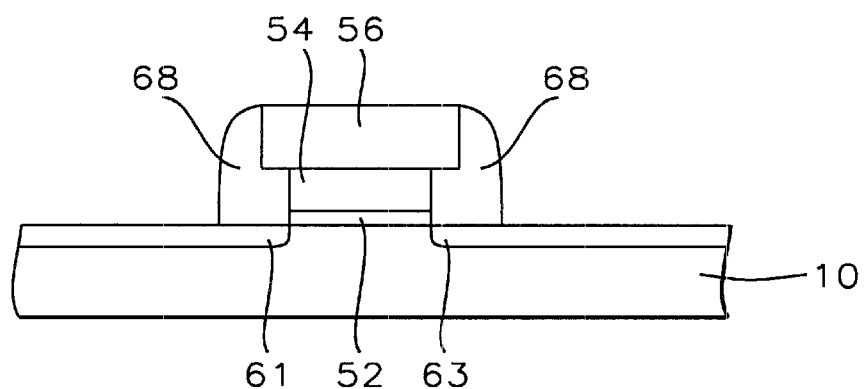

The formation of first gate spacers 68, FIG. 8, can comprise the thermally growing of a thin layer 66, FIG. 7, of oxide on the sides of said gate electrode using a short dry-oxidation process. Layer 66 can also be created by depositing a conformal layer of CVD oxide film by decomposing TEOS at between 650 and 800 degrees C. Gate spacers 68 are, after the creation of layer 66 is completed, formed by performing an anisotropic dry etch of layer 66, thereby leaving said spacers 68, FIG. 8, on the sidewalls of said gate electrode 54/56.

It must be noted in the cross section of FIG. 8 that the layer. 52, FIG. 7, of high-k gate dielectric, has been removed (by the anisotropic dry etch that has been applied to create the first gate spacers 68) from above the surface of substrate 10 where this surface of not covered by the gate structure 54/56 or by the newly created first gate spacers 68.

Figure 9:
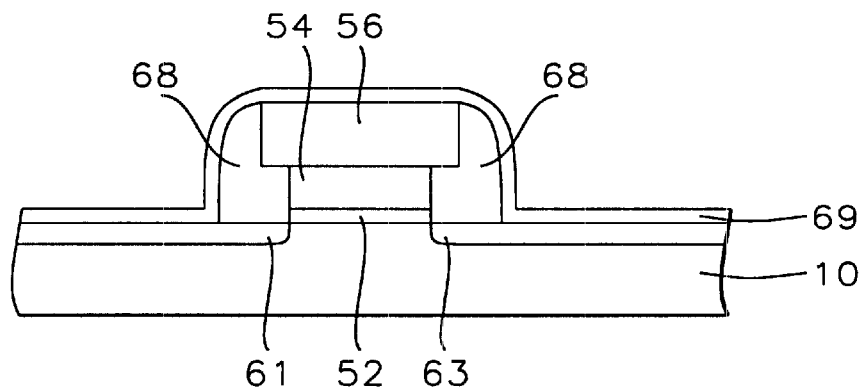
Figure 10:
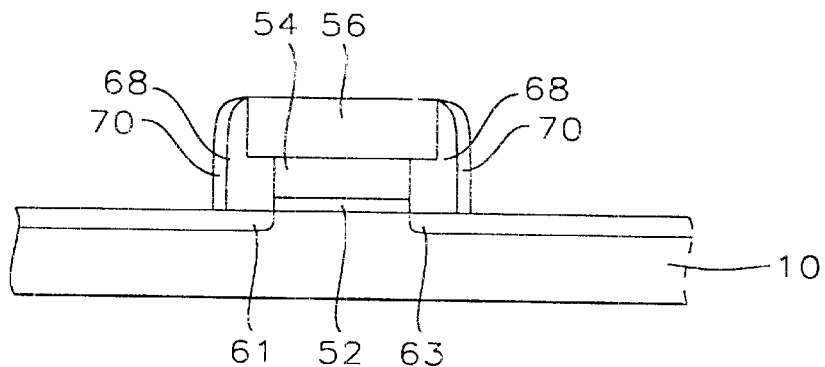

The invention proceeds with the creation of second or main gate spacers overlying the surface of the first gate spacers 68. The steps that are required to create the second gate spacers 70, FIG. 10, follow essentially the same procedures as have been used for the creation of the first gate spacers. The second gate spacers are formed by depositing a layer 69, preferably comprising TEOS of silicon nitride, FIG. 9, over the surface of the created structure including the surface of first gate spacers 68 and again applying an anisotropic etch to the surface of the deposited layer 69. The result is the creation of the second or main gate spacers 70 that are shown in cross section in FIG. 10. An additional step of annealing the second gate spacers 70 may be performed at this time. Since this creation of the second gate spacers completes the creation of the gate spacers for the gate structure 54/56, the source/drain implant 75, FIG. 11, can next be performed, self-aligned with the gate structure 54/56. Source region 65, adjacent to and gradually interfacing with LDD region 61, and drain region 67, adjacent to and gradually interfacing with LDD region 63, are in this manner created in the surface of substrate 10.

As an example of the creation of lightly doped source and drain region can be cited using phosphorous implanted at an energy between about 5 to 100 KeV, at a dose between about 1E11 to 1E14 atoms/cm$^2$.

As an example of the creation a medium doped source and drain region using arsenic or phosphorous implanted at an energy between about 10 to 50 KeV, at a dose between about 1E12 to 5E14 atoms/cm$^2$.

As an example of the creation a heavily doped source and drain region using arsenic implanted at an energy between about 20 to 90 KeV, at a dose between about 1E15 to 1E16 atoms/cm$^2$.

More specifically, to form the source and drain regions for the CMOS devices, an p-well region is subjected to an n-type implant, for instance arsenic at a dose of between about 2.0E15 and 1.0E16 ions/cm$^2$ and an energy of between about 20 and 70 KeV. An n-well region is subjected to an p-type implant, for instance boron at a dose of between about 1.0E15 and 1.0E16 ions/cm$^2$ and an energy of between about 4 and 10 KeV.

After the source/drain regions 65/67 have been implanted into the surface of substrate 10, the structure will be subjected to RTA to activate source/drain implanted species and may be subjected to a step of vacuum baking in order to further solidify the surface of the second gate spacers 70. This vacuum bake is in-situ or ex-situ vacuum baking the substrate at a temperature in the range of about 300 to 350 degrees C. for a time between about 25 and 35 minutes and a pressure between about 0.5 and 1000 mTorr.

Figure 12:
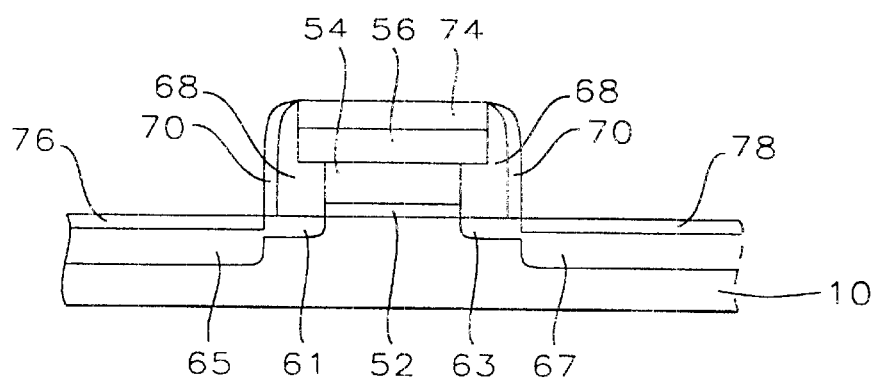

The gate structure of FIG. 12 is now ready for final processing steps, that is the establishment of low resistivity contacts to the gate electrode and the source/drain regions of the gate electrode. The method of self-aligned silicide (salicide) formation, which self-registers with the contacts at the top of the polysilicon gate and the source and drain surfaces, helps to solve the problem of critical dimension tolerance. Salicides have thus become almost universal in today's high-density MOSFET (Metal-Oxide-Semiconductor Field-Effect Transistors) devices.

The ability to achieve successful salicide formation is dependent on the integrity of the insulator spacers, on the sides of the polysilicon gate structure, during the salicide formation procedure. For example prior to metal deposition, native oxide on the exposed top surface of the polysilicon gate structure, as well as the top surface of the source and drain region, has to be removed, to allow the subsequent metal silicide formation to be successful. Native oxide will prevent the reaction between the metal and the exposed silicon surfaces during an anneal cycle. Therefore a buffered hydrofluoric acid procedure is used prior to metal deposition. However if, as a result of the buffered hydrofluoric acid metal pre-cleaning procedure, the insulator spacers (on the sides of the polysilicon gate structure) become defective or significantly thinned, thereby exposing polysilicon, the formation of unwanted metal silicide or bridging of the metal silicide can occur on the sides of the polysilicon gate structure. This results in gate to substrate shorting or leakage.

From the processing sequence that has been followed by the invention up to this time, it is clear that the above listed concerns have been effectively addressed by the invention by the creation of two overlying layers of gate spacers and the thorough removal of the layer 52 of gate dielectric from the surface of substrate 10.

To reduce contact resistance with the points of electrical contact of the gate electrode, these contact regions are salicided. This is accomplished by forming a silicide film of a metal that has a high melting point on these surfaces. A titanium silicide film is mainly used as the high melting point silicide film while cobalt silicide and nickel silicide film have also been investigated. The basic success of forming salicided contact layers can be achieved due to the fact that certain metals, such as titanium or cobalt, react when heated while they are in contact with silicon or doped or undoped polysilicon. This reaction forms conductive silicides over the surface of these layers while the metal however does not react with silicon oxides. By forming silicon oxide spacers on the sidewalls of the gate electrode, the deposited metal does not interact with the sidewalls of the gate electrode and separate points of electrical contact can be formed for the source/drain regions and the surface of the gate electrode. The salicided source contact surface has been highlighted with surface region 76, FIG. 12, the salicided drain contact surface has been highlighted with surface region 78, the salicided gate electrode contact surface has been highlighted with surface region 74. The process of salicidation can be applied using two thermal anneals, a first anneal to convert the deposited layer of metal to a salicided material, the second anneal to convert the salicided material to a low resistivity phase. The anneal to form thin layers of salicided material, such as titanium silicide (TiSi$_2$) over the source/drain regions and the gate structure can therefore be a rapid first thermal anneal in a temperature range of between 600 and 700 degrees C. for a time of between 20 and 40 seconds, followed by a rapid second thermal anneal in a temperature of between about 800 and 900 degrees C. for a time between 20 and 40 seconds. As for cobalt silicide, the first annealing is a RTA at a temperature in the range of 480 to 520 degrees C., followed by a second RTA at a temperature in the range of 800 and 850 degrees C.

Figure 11:
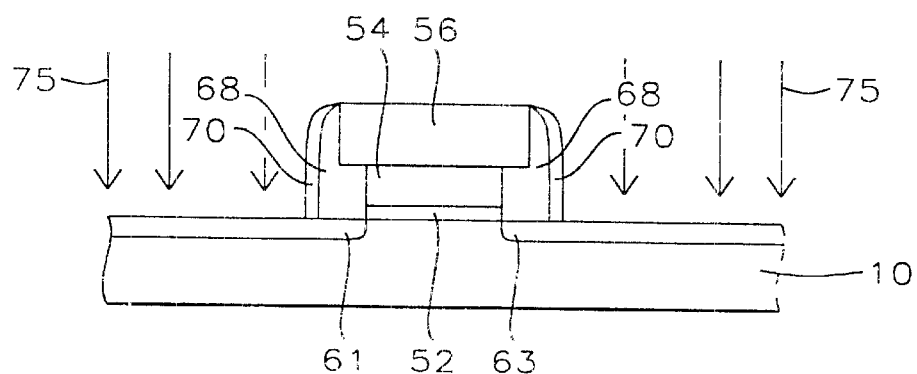
Figure 13:
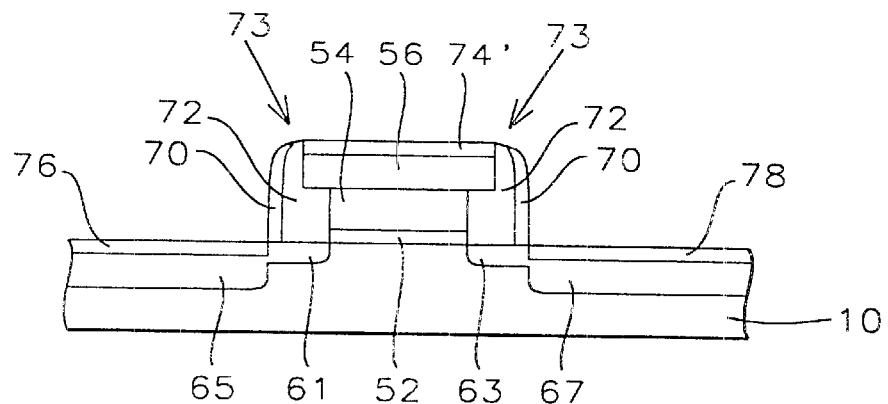

The structure that is shown in cross section in FIG. 11 contains two overlying layers of gate spacers over the sidewalls of gate structure 54/56, that is the first gate spacers 68 over the surface of which the second gate spacers 70 have been created. The structure can further be improved by creating a vacuum between the second gate spacers 70 and the gate structure 52/54 by removing the first gate spacers 68. In order to accomplish this removal of first gate spacers 68, typically of a low-k, oxide based dielectric, an opening can be created between the upper extremities of the first and second gate spacers where these first and second gate spacers interface (make contact) with each other. This by applying methods of CMP to the salicided surface of layer 74, FIG. 11, removing this layer over a height and converting this layer to layer 74', FIG. 13, which has a height which is less than the height of layer 74, FIG. 12, by a measurable amount. This removes the second gate spacers from above the first gate spacers at the upper extremities of these gate spacers, creating an opening 73 through which the first gate spacers material can be removed. This replaces the low-k dielectric material of the first gate spacers 68, FIG. 12, with air, significantly reducing the dielectric constant of the first gate spacer (now the dielectric constant of air), thereby significantly reducing the effective dielectric constant of the gate spacers 70/72 and further reducing the fringe coupling capacitance.

Figure 14:
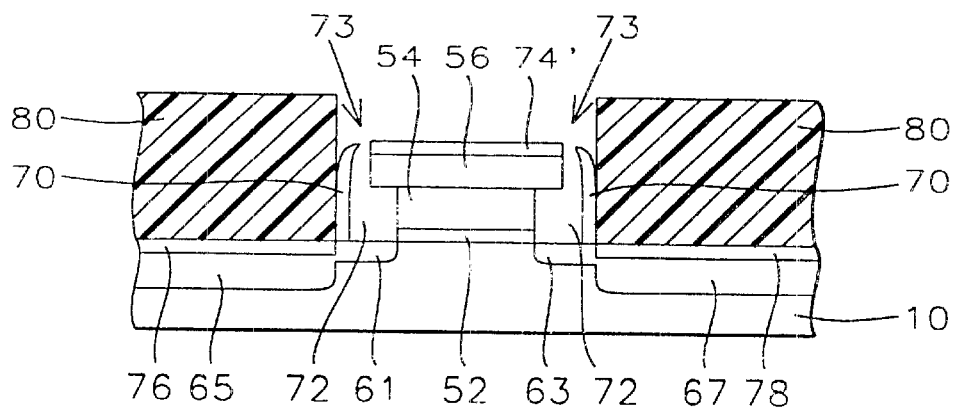

The removal of the low-k based first gate spacers requires the processing steps of depositing a layer 80 of photoresist over the surface of the structure that is shown in cross section in FIG. 14 and patterning this layer of photoresist such that the openings 73 between the first and the second gate spacers are exposed. After layer 80 of photoresist has been patterned in this manner, an isotropic oxide etch is provided to the surface of layer 72, (FIG. 13), causing the low-k dielectric 72 to be removed from between the gate structure 54/56 and the second gate spacers 70. The vacated opening of the second gate spacers 72, FIG. 14, is now essentially filled with air, providing the beneficial results that have been highlighted above. After the first gate spacers have been removed from the structure, the layer 80 of photoresist mask can be removed from the surface after which the gate electrode is ready for further processing for the creation of electrical contacts to the gate electrode and for further interconnect of the gate electrode to surrounding circuitry.

The invention can be summarized as follows:

the invention starts with a silicon substrate having a bare surface in succession are deposited over the surface of the substrate a layer of gate dielectric (gate,pad material of high-k dielectric), over which a layer of bottom gate material, over which a layer of top gate material; the bottom gate electrode material preferably comprises polysilicon-germanium or doped polysilicon, the top gate electrode material preferably comprises undoped polysilicon, over the surface of the top gate material are successively deposited a layer of hard mask material (preferably comprising SiON), over which a layer of BARC material the BARC material and the hard mask material are patterned and etched, leaving in place of these layers of hard mask and BARC a patterned layer that aligns with the surface region of the substrate over which a gate electrode must be created the patterned layer of BARC material is removed, leaving the patterned layer of hard mask material in place over the surface of the layer of top gate material; the layer of bottom gate material and the layer of top gate material are etched in accordance with the patterned layer of hard mask material, exposing the surface of the layer of gate dielectric; an overetch is applied to the layer of bottom gate material creating an overhang of the layer of top gate material LDD implants are performed into the surface of the substrate, self-aligned with the patterned and etched layers of bottom gate material and of top gate material the patterned layer of hard etch material is removed from the surface of the patterned layer of top gate material a first layer of gate spacer material (low-k dielectric) is deposited over the exposed surface of the layer of gate dielectric, including the surface of the patterned top gate material first gate electrodes are formed over the sidewalls of the gate structure by etching the deposited first layer of gate spacer material, the exposed layer of gate dielectric is removed from the surface of the substrate, exposing the surface of the substrate a second layer of gate spacer material (TEOS or silicon nitride) is deposited over the exposed surface of the substrate, including the surface of the first gate spacers second gate electrodes are formed over the surface of the first gate spacers by etching the deposited second layer of gate spacer material source/drain implants are performed into the surface of the substrate, self-aligned with the second gate spacers contact regions to the gate electrode are salicided (optionally) the first gate spacers are removed by creating an opening between the gate and second gate spacers where these gate spacers physically interact (using methods of CMP) thereby exposing the first gate spacers, a photoresist mask is created overlying the structure and exposing the openings that have been created between the first and second gate spacers, the first gate spacers are removed by applying an isotropic etch to the first gate spacers.

These processing steps may be further enhanced by annealing the second gate spacers after these second gate spacers have been created and prior to performing a source/drain region impurity implant.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a gate electrode for high-performance sub-micron CMOS devices, comprising the steps of:

providing a silicon substrate having a bare surface;

depositing a layer of high-k gate dielectric over the surface of said substrate, followed by depositing a layer of bottom gate material over the surface of the layer of gate dielectric, followed by depositing a layer of top gate material over the surface of the layer of bottom gate material;

depositing a layer of hard mask material over the surface of the layer of top gate material followed by depositing a layer of bottom anti reflective coating material over the surface of the layer of hard mask material;

patterning the layer of bottom anti reflective coating material and the layer of hard mask material;

removing the patterned layer of bottom anti reflective coating material;

etching the layer of bottom gate material and the layer of top gate material in accordance with the patterned layer of hard mask material, creating an overhang of the layer of top gate material, exposing a surface area of said layer of high-k gate dielectric;

performing LDD implants into the surface of the substrate;

performing pocket and LDD implants under an angle with the surface of said substrate, said angle being different from a 90 degree angle by an amount;

removing the patterned layer of hard mask material from the surface of the patterned layer of top gate material;

creating first gate spacers over sidewalls of said patterned and etched bottom and top layers of gate material, said first gate spacers comprising a low-k dielectric material;

creating second gate spacers over the surface of said first gate spacers, said second gate spacers comprising TEOS or silicon nitride;

performing source/drain implants into the surface of the substrate, self-aligned with the second gate spacers;

creating salicided contact surface regions to the source and drain regions and the surface of the top layer of gate material; and removing said first gate spacers from between said patterned and etched layers of top and bottom gate material and said second spacers, said removing comprising:
(i) removing the second gate spacers from above the first gate spacers in upper regions of the first and second gate spacers by polishing the salicided surface of the top layer of gate material, applying methods of Chemical Mechanical Polishing (CMP) to this surface, exposing the first gate spacers;
(ii) creating a photoresist mask overlying the surface of said substrate and the surface of said second gate spacers, said photoresist mask exposing the first gate spacers; and
(iii) applying an isotropic etch to the first gate spacers, thereby removing the first gate spacers.

2. The method of claim 1, the layer of bottom gate electrode material preferably comprising a material selected for the group consisting of polysilicon-germanium and doped polysilicon, the layer of top gate electrode material preferably comprising undoped polysilicon.

3. The method of claim 1, the layer of hard mask material preferably comprising silicon oxynitride.

4. The method of claim 1 with an additional step of annealing the second gate spacers, said additional step being performed prior to performing said source/drain implants.

5. The method of claim 1, said LDD implants into the surface of said substrate being performed perpendicular to the surface of said substrate.

6. The method of claim 1, said pocket implants into the surface of the substrate being performed under an angle with the surface of said substrate, said angle being between about 15 and 45 degrees.

7. The method of claim 1 wherein creating first gate spacers over sidewalls of said patterned and etched layers of bottom and top gate material comprises the steps of:

depositing a first layer of gate spacer material over exposed surface of the layer of gate dielectric, including the surface of the patterned layer of top gate material, said first layer of gate spacer material comprising a low-k dielectric, said first layer of gate spacer material being deposited using methods of spin-coating followed by baking or by methods of CVD; and etching the deposited first layer of gate spacer material, forming the first gate spacers over the sidewalls of the patterned and etched layers of top and bottom gate material, further removing the exposed layer of gate dielectric from the surface of the substrate, exposing the surface of the substrate.

8. The method of claim 1 wherein creating second gate spacers over the surface of said first gate spacers comprises the steps of:

depositing a second layer of gate spacer material over the exposed surface of the substrate, including the surface of the first gate spacers, said second layer of gate spacer material comprising TEOS or silicon nitride; and etching said second layer of gate spacer material, forming second gate spacers over the surface of the first gate spacers.

9. A method for creating a gate electrode for high-performance sub-micron CMOS devices, comprising the steps of:

providing a silicon substrate;

performing a gate stack film deposition;

photo patterning and dry etching a hard mask;

performing a gate etch, using the created hard mask as an etch mask, creating a gate structure;

performing an Lightly Doped Diffusion (LDD) impurity implant into the surface of the substrate;

removing the hard mask from the surface of the gate structure;

coating a low-k film over the surface of the gate structure;

creating low-k gate spacers over sidewalls of the gate structure;

creating main gate spacers on the surface of the low-k spacers;

performing source/drain impurity implants into the surface of the substrate, self aligned with the gate structure;

saliciding source/drain surfaces and the surface of the gate structure; and removing said low-k gate spacers from between said gate structure and said main gate spacers, said removing comprising:
(i) creating openings in the main gate spacers by polishing the surface of the salicided surface of the gate structure, applying methods of Chemical Mechanical Polishing (CMP) to this surface, thereby exposing the low-k gate spacers;
(ii) creating a photoresist mask overlying the surface of said substrate and the surface of said main gate spacers, said photoresist mask exposing the openings created in the main gate spacers, thereby exposing the low-k gate spacers; and
(iii) applying an isotropic etch to the low-k gate spacers, thereby removing the low-k gate spacers.

10. The method of claim 9, said performing a gate stack film deposition comprising the steps of:

depositing a layer of high-k gate dielectric over the surface of said substrate; then depositing a layer of bottom gate material over the surface of the layer of high-k gate dielectric; and then depositing a layer of top gate material over the surface of the layer of bottom gate material.

11. The method of claim 10, the bottom gate electrode material preferably being selected from the group consisting of polysilicon-germanium or doped polysilicon, the top gate electrode material preferably comprising undoped polysilicon.

12. The method of claim 9 wherein said photo patterning and dry etching a hard mask comprises the steps of:

depositing a layer of hard mask material over the surface of a layer of top gate material; then depositing a layer of bottom anti reflective coating over the surface of the layer of hard mask material; then patterning and etching the layer of bottom anti reflective coating material and the layer of hard mask material, leaving in place layers of hard mask material and bottom anti reflective coating material that align with the surface region of the substrate over which a gate electrode must be created; and then removing the patterned layer of bottom anti reflective coating material, leaving the patterned layer of hard mask material in place over the surface of a layer of top gate material.

13. The method of claim 12, the layer of hard mask material preferably comprising silicon nitride.

14. The method of claim 9 wherein said performing a gate etch, using the created hard mask as an etch mask, creating a gate structure comprises the steps of etching a layer of bottom gate material and a layer of top gate material in accordance with the patterned layer of hard mask material, exposing the surface of a layer of gate dielectric, said etching the layer of bottom gate material and the layer of top gate material comprising applying an overetch to the layer of bottom gate material, creating an overhang of the layer of top gate material.

15. The method of claim 9, said Lightly Doped Diffusion (LDD) impurity implant into the surface of the substrate being performed perpendicular to the surface of said substrate.

16. The method of claim 9, said coating a low-k film over the surface of the gate structure comprising methods of spin-coating followed by baking or by methods of CVD.

17. The method of claim 9, said creating low-k gate spacers over sidewalls of the gate structure comprising the step of etching the low-k film coated over the surface of the gate structure, thereby further removing a layer of gate dielectric from the surface of the substrate, exposing the surface of the substrate.

18. The method of claim 9, said creating main gate spacers of the surface of the low-k spacers comprising the steps of:

depositing a layer of gate spacer material over the exposed surface of the substrate, including the surface of the low-k gate spacers created over sidewalls of the gate structure, said second layer of gate spacer material comprising TEOS or silicon nitride; and etching said layer of gate spacer material, forming main gate spacers over the surface of the low-k gate spacers.

* * * * *